(12) United States Patent
Mashimo

(10) Patent No.: US 6,611,179 B2
(45) Date of Patent: Aug. 26, 2003

(54) VOLTAGE-CONTROLLED OSCILLATOR AND COMMUNICATION APPARATUS INCORPORATING THE SAME

(75) Inventor: Yoshiyuki Mashimo, Schwabach (DE)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/916,182

(22) Filed: Jul. 26, 2001

(65) Prior Publication Data

US 2002/0067217 A1 Jun. 6, 2002

(30) Foreign Application Priority Data

Jul. 27, 2000 (JP) ......................................... 2000-227630

(51) Int. Cl.[7] ................................................ H03B 1/00
(52) U.S. Cl. ................... 331/177 V; 331/167; 331/105; 331/177 D
(58) Field of Search ............................. 331/177 V, 167, 331/105, 108, 177 D, 177 R, 96

(56) References Cited

U.S. PATENT DOCUMENTS

| 3,137,826 | A | | 6/1964 | Boudrias | |
|---|---|---|---|---|---|
| 4,709,409 | A | * | 11/1987 | Ma et al. ................. | 331/177 V |
| 4,797,638 | A | * | 1/1989 | Usui et al. .............. | 331/177 V |
| 4,978,930 | A | * | 12/1990 | Suter ....................... | 331/177 V |
| 5,721,517 | A | * | 2/1998 | Goma et al. ............. | 331/177 V |
| 5,852,384 | A | * | 12/1998 | Sakakura et al. ........ | 331/177 V |
| 5,905,414 | A | * | 5/1999 | Motoi ..................... | 331/177 V |

FOREIGN PATENT DOCUMENTS

| EP | 1 111 771 | 6/2001 |
|---|---|---|
| JP | 10-163750 | 6/1998 |
| WO | WO99/57803 | 11/1999 |

* cited by examiner

*Primary Examiner*—Michael Tokar
*Assistant Examiner*—Lam T. Mai
(74) *Attorney, Agent, or Firm*—Keating & Bennett, LLP

(57) ABSTRACT

A voltage-controlled oscillator has a structure that is very compact and prevents characteristic deterioration. The voltage-controlled oscillator includes a first resonant circuit resonating in a first frequency band, a second resonant circuit resonating in a second frequency band that is higher than the first frequency band, an oscillation circuit oscillating at a resonance frequency of each of the first and second resonant circuits, an amplifying circuit amplifying an oscillation signal transmitted from the oscillation circuit, a control terminal applying a control voltage to each of the first and second resonant circuits, a power-source terminal commonly connected to the oscillation circuit and the amplifying circuit, and an output terminal outputting a high frequency signal.

20 Claims, 4 Drawing Sheets

VOLTAGE-CONTROLLED OSCILLATOR AND COMMUNICATION APPARATUS INCORPORATING THE SAME

BACKGROUND OF THE INVENTION

1. Field of the Invention

The present invention relates to voltage-controlled oscillators and communication apparatuses incorporating the same. More particularly, the present invention relates to voltage-controlled oscillators generating high frequency signals in different frequency bands and communication apparatuses incorporating the oscillators.

2. Description of the Related Art

Recently, multiple communication systems using different frequency bands have come into widespread use. The recent tendency has permitted a single communication apparatus to be used to handle multiple communication systems. In this case, in the communication apparatus, it is necessary for a high frequency oscillation circuit such as a voltage-controlled oscillator defining a local oscillation circuit to generate signals having different frequency bands according to the multiple communication systems.

FIG. 7 shows a circuit diagram of a conventional voltage-controlled oscillator. In this figure, there is shown a voltage-controlled oscillator 50 generating high frequency signals of two different frequency bands disclosed in Japanese Unexamined Patent Application Publication No. 10-163750. The voltage-controlled oscillator 50 includes first and second resonant circuits 51a and 51b, first and second oscillation circuits 52a and 52b oscillating at resonance frequencies of the first and second resonant circuits 51a and 51b, an amplifying circuit 53 amplifying oscillation signals of the first and second oscillation circuits 52a and 52b, a control terminal 54 applying a control voltage to each of the first and second resonant circuits 51a and 51b, power-source terminals 55a and 55b of the first and second oscillation circuits 52a and 52b, a power-source terminal 56 of the amplifying circuit 53, and an output terminal 57 outputting a high frequency signal.

The first resonant circuit 51a includes a variable-capacitance diode D51a, a stripline S51a defining a resonator, a frequency adjusting capacitor C51a, a coil L51a, and a capacitor C52a. The second resonant circuit 51b includes a variable-capacitance diode D51b, a stripline S51b defining a resonator, a frequency adjusting capacitor C51b, a coil L51b, and a capacitor C52b. The stripline S51a and the variable-capacitance diode D51a constitute a parallel resonant circuit, and the stripline S51b and the variable-capacitance diode D51b also constitute a parallel resonant circuit.

The first oscillation circuit 52a includes a transistor Q51a, capacitors C53a to C55a, and resistors R51a to R53a. The second oscillation circuit 52b includes a transistor Q51b, capacitors C53b to C55b, and resistors R51b to R53b. The amplifying circuit 53 includes a transistor Q52, a coil L52, capacitors C56 to C60, and resistors R54 to R56.

The first resonant circuit 51a is connected to the first oscillation circuit 52a via a coupling capacitor C61a, and the second resonant circuit 51b is connected to the second oscillation circuit 52b via a coupling capacitor C61b. The first and second oscillation circuits 52a and 52b are connected to the amplifying circuit 53 via coupling capacitors C62a and C62b.

Next, a description will be provided of the operation of the voltage-controlled oscillator 50 shown in FIG. 7. When a power source is supplied to the power-source terminal 55a of the first oscillation circuit 52a and a power source is not supplied to the power-source terminal 55b of the second oscillation circuit 52b, only the first oscillation circuit 52a is driven whereas the second oscillation circuit 52b is not driven. In addition, when a power source is supplied to the amplifying circuit 53 from the power-source terminal 56, the amplifying circuit 53 is driven. In this case, in a range permitting oscillation of the first oscillation circuit 52a, a high frequency signal according to a direct current voltage applied by the control terminal 54 is output from the output terminal 57. In contrast, when a power source is supplied to the power-source terminal 55b of the second oscillation circuit 52b and a power source is not supplied to the power-source terminal 55a of the first oscillation circuit 52a, in a range permitting oscillation of the second oscillation circuit 52b, a high frequency signal according to a direct current voltage applied by the control terminal 54 is output from the output terminal 57.

The above-described operation can be performed by roughly coupling the first and second oscillation circuits 52a and 52b and the amplifying circuit 53 defining the voltage-controlled oscillator 50 via the coupling capacitors C62a and C62b having low capacitances so that no frequency change occurs even though the impedance of the output terminal 57 of the voltage-controlled oscillator 50 changes. For example, when the first oscillation circuit 52a is driven and the second oscillation circuit 52b is not driven, of the oscillation signals of the first oscillation circuit 52a, most of signals passing through the coupling capacitor C62a flow into the amplifying circuit 53 and hardly flow into the second oscillation circuit 52b, which is not driving, via the coupling capacitor C62b. In other words, since the coupling capacitors C62a and C62b are capacitors provided for rough coupling, as compared with the impedance of an input terminal of the amplifying circuit 53, each of the capacitors C62a and C62b has significantly high impedance. As a result, most of the oscillation signals of the first oscillation circuit 52a flow into the amplifying circuit 53 having low impedance. This is also applied to the case in which the second oscillation circuit 52b oscillates and the first oscillation circuit 52a does not oscillate. With this arrangement, without causing any mutual influence between the first and second oscillation circuits 52a and 52b, the first and second oscillation circuits 52a and 52b can be connected to the amplifying circuit 53.

However, the above conventional voltage-controlled oscillator requires a plurality of oscillation circuits to respond to different frequency bands. Thus, there is a problem in that the size of the voltage-controlled oscillator tends to be larger.

Furthermore, when characteristic deterioration occurs in the coupling capacitors connecting the plurality of oscillation circuits and the amplifying circuit, the oscillation signals of the driving oscillation circuit flow into the oscillation circuit that is not driving. As a result, the characteristics of the voltage-controlled oscillation circuit are deteriorated.

SUMMARY OF THE INVENTION

In order to overcome the problems described above, preferred embodiments of the present invention provide a voltage-controlled oscillator having a greatly reduced size and a structure that prevents characteristic deterioration. In addition, preferred embodiments of the present invention provide a communication apparatus including a voltage-controlled oscillator having a greatly reduced size and a structure that prevents characteristic deterioration.

A voltage-controlled oscillator according to a preferred embodiment of the present invention includes a first resonant circuit resonating in a first frequency band, a second resonant circuit resonating in a second frequency band that is higher than the first frequency band, an oscillation circuit oscillating at respective resonance frequencies of each of the first and second resonant circuits, and an amplifying circuit amplifying an oscillation signal transmitted from the oscillation circuit. In this oscillator, the first resonant circuit has high impedance in the second frequency band.

In addition, the first resonant circuit may be a series resonant circuit including a variable-capacitance diode and a resonator, and the second resonant circuit may be a parallel resonant circuit including a variable-capacitance diode and a resonator.

In addition, each of the first and second resonant circuits may be a series resonant circuit including a variable-capacitance diode and a resonator.

Another preferred embodiment of the present invention provides a communication apparatus incorporating the novel voltage-controlled oscillator described above.

In the voltage-controlled oscillator according to preferred embodiments of the present invention, since the first resonant circuit maintains high impedance in the second frequency band permitting the oscillation of the second resonant circuit, this unique arrangement prevents the first resonant circuit from imposing a load on the second resonant circuit in the second frequency band.

In the communication apparatus of other preferred embodiments of the present invention, since the voltage-controlled oscillator is capable of preventing the characteristic deterioration in the first and second frequency bands, the communication apparatus achieves excellent communication characteristics both in the first and second frequency bands.

Other features, elements, characteristics, and advantages of the present invention will become more apparent from the following detailed description of the preferred embodiments of the present invention with reference to the attached drawings.

DETAILED DESCRIPTION OF PREFERRED EMBODIMENTS

A description will be provided of preferred embodiments of the present invention with reference to the drawings.

Figure 1:
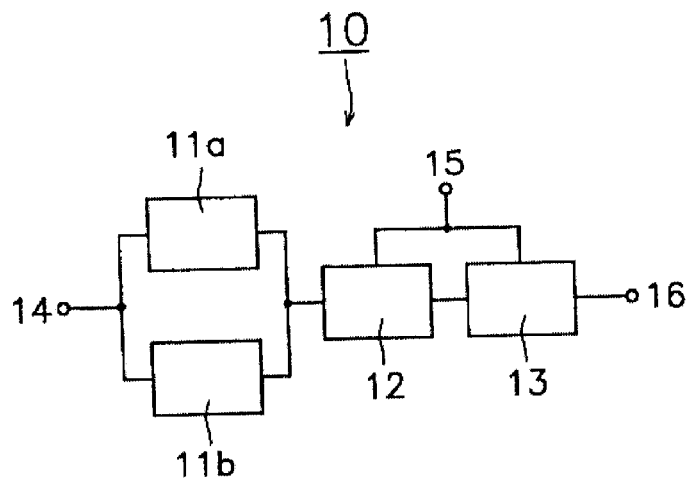
FIG. 1 shows a block diagram of a voltage-controlled oscillator according to a first preferred embodiment of the present invention.
Figure 2:
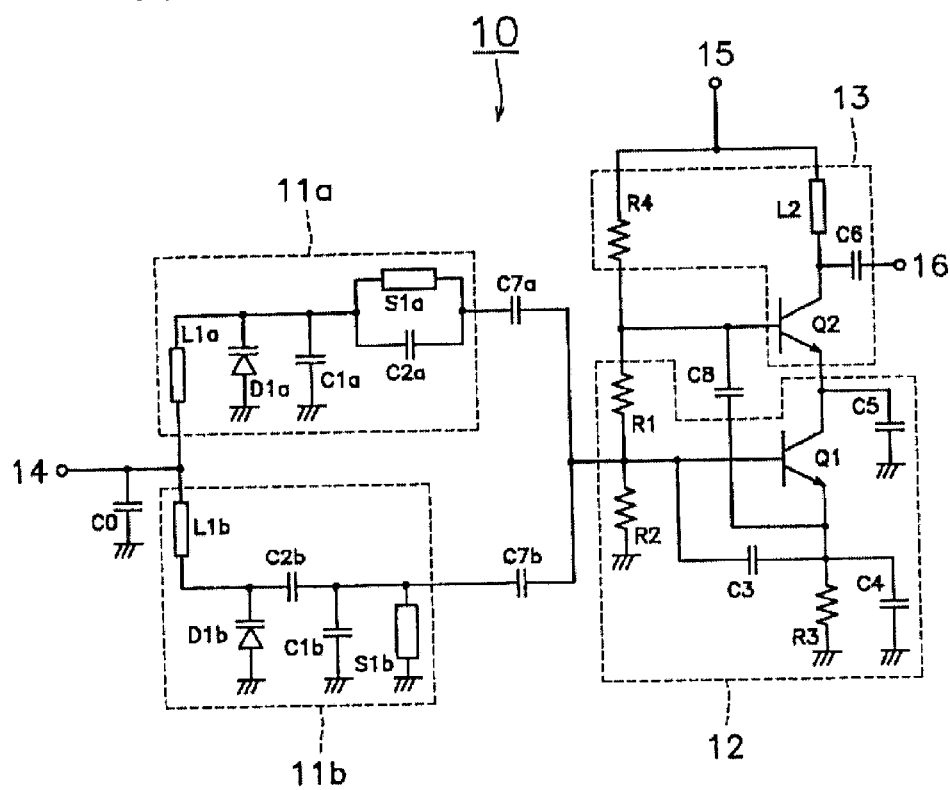
FIG. 2 shows a circuit diagram of the voltage-controlled oscillator shown in FIG. 1.

FIGS. 1 and 2 show a block diagram and a circuit diagram of a voltage-controlled oscillator according to a first preferred embodiment of the invention. A voltage-controlled oscillator 10 preferably includes a first resonant circuit 11a resonating in a first frequency band, a second resonant circuit 11b resonating in a second frequency band that is higher than the first frequency band, an oscillation circuit 12 oscillating at a resonance frequency of each of the first and second resonant circuits 11a and 11b, an amplifying circuit 13 amplifying an oscillation signal transmitted from the oscillation circuit 12, a control terminal 14 applying a control voltage to each of the first and second resonant circuits 11a and 11b, a power-source terminal 15 commonly connected to the oscillation circuit 12 and the amplifying circuit 13, and an output terminal 16 outputting a high frequency signal.

The first resonant circuit 11a preferably includes a variable-capacitance diode D1a, a stripline S1a defining a resonator, a coil L1a, capacitors C1a and C2a. In this case, the variable-capacitance diode D1a and the stripline S1a define a series resonant circuit for determining a resonance frequency of the first resonant circuit 11a.

The second resonant circuit 11b preferably includes a variable-capacitance diode D1b, a stripline S1b defining a resonator, a coil L1b, capacitors C1b and C2b. In this case, the variable-capacitance diode D1b and the stripline S1b define a parallel resonant circuit for determining a resonance frequency of the second resonant circuit 11b.

The control terminal 14 applying a control voltage to each of the first and second resonant circuits 11a and 11b is grounded via a capacitor C0.

The oscillation circuit 12 preferably includes a transistor Q1, capacitors C3 to C5, and resistors R1 to R3. The power-source terminal 15 is connected to the collector of the transistor Q1 via the amplifying circuit 13.

The amplifying circuit 13 has a transistor Q2, a coil L2, a capacitor C6, and a resistor R4. The power-source terminal 15 is connected to the collector of the transistor Q2 via the coil L2. The collector of the transistor Q2 is connected to the output terminal 16 via the capacitor C6.

The first and second resonant circuits 11a and 11b are connected to the oscillation circuit 12 via coupling capacitors C7a and C7b. The oscillation circuit 12 is connected to the amplifying circuit 13 via a coupling capacitor C8.

Figure 3:
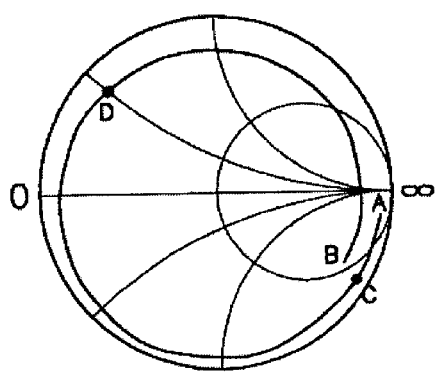
FIG. 3 shows a Smith chart for illustrating input impedance of the second resonant circuit defining the voltage-controlled oscillator shown in FIG. 2.

FIG. 3 shows a Smith chart for illustrating input impedance of the second resonant circuit shown in FIG. 2. The second resonant circuit 11b having the parallel resonant circuit including the variable-capacitance diode D1b and the stripline S1b has input impedance changing from point A to point B when the frequency is changed.

The input impedance of the second resonant circuit 11b becomes high at 900 MHz (point C) as the first frequency band in which the first resonant circuit resonates. After that, as the frequency becomes higher, the impedance becomes lower. Then, the input impedance becomes almost zero at 1800 MHz (point D) as the second frequency band in which the second resonant circuit resonates.

In other words, although the second resonant circuit 11b is the parallel resonant circuit including the variable-capacitance diode D1b and the stripline S1b, high impedance is maintained at 900 MHz (point C). Thus, even though the second resonant circuit is connected to the first resonant circuit, the second resonant circuit is not a load on the first resonant circuit. Therefore, influence of the second resonant circuit on the first resonant circuit at 900 MHz is minimized.

Figure 4A:
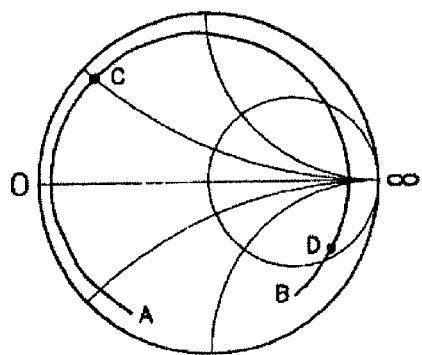
FIG. 4A shows a Smith chart for illustrating input impedance of a first resonant circuit defining the voltage-controlled oscillator shown in FIG. 2.
Figure 4B:
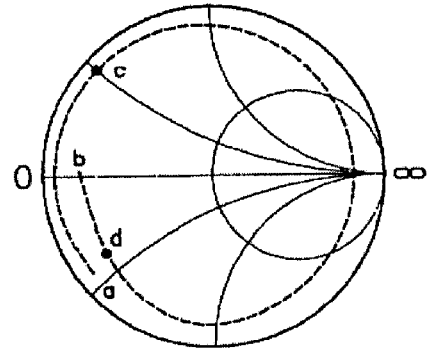
FIG. 4B shows a Smith chart for illustrating input impedance of a first resonant circuit of a conventional voltage-controlled oscillator.
Figure 7:
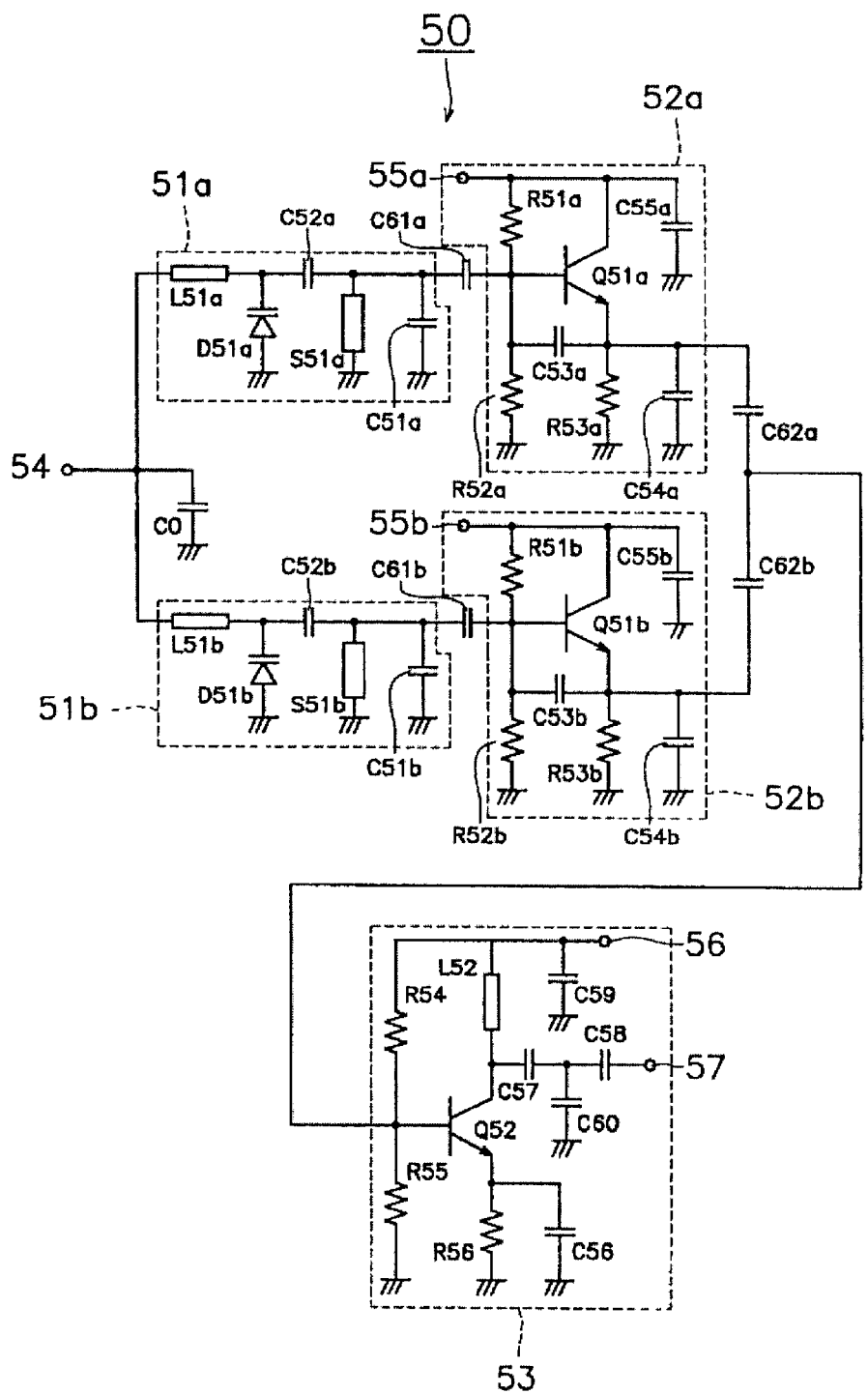
FIG. 7 shows a circuit diagram of the conventional voltage-controlled oscillator.

FIG. 4A shows a Smith chart for illustrating input impedance of the first resonant circuit 11a shown in FIG. 2, and FIG. 4B shows a Smith chart for illustrating input impedance of the first resonant circuit 51a of the conventional oscillator shown in FIG. 7.

The input impedance of the first resonant circuit 11a having the series resonant circuit including the variable-capacitance diode D1a and the stripline S1a, as shown in FIG. 4A, changes from the point A to the point B when the frequency is changed. Then, the input impedance becomes almost zero at 900 MHz (point C) as the first frequency band in which the first resonant circuit resonates. After that, as the frequency becomes higher, the input impedance becomes higher, and high impedance is maintained even at 1800 MHz (point D) as the second frequency band in which the second resonant circuit resonates. In this case, the high impedance is almost equal to the impedance (see FIG. 3) of the second resonant circuit in the first frequency band (900 MHz).

On the other hand, the input impedance of the first resonant circuit 51a having the series resonant circuit including the variable-capacitance diode D51a and the stripline S51a, as shown in FIG. 4B, changes from point a to point b when the frequency is changed. Then, the input impedance becomes almost zero at 900 MHz (point c), and after that, the higher the frequency, the higher the input impedance. However, at 1800 MHz (point d), the impedance becomes almost zero.

That is, when the first resonant circuit 11a has the series resonant circuit, high impedance is maintained even at 1800 MHz (point D). Thus, even though the first resonant circuit is connected to the second resonant circuit, the first resonant circuit does not become a load on the second resonant circuit. As a result, the first resonant circuit has slight influence on the second resonant circuit at 1800 MHz.

Figure 5:
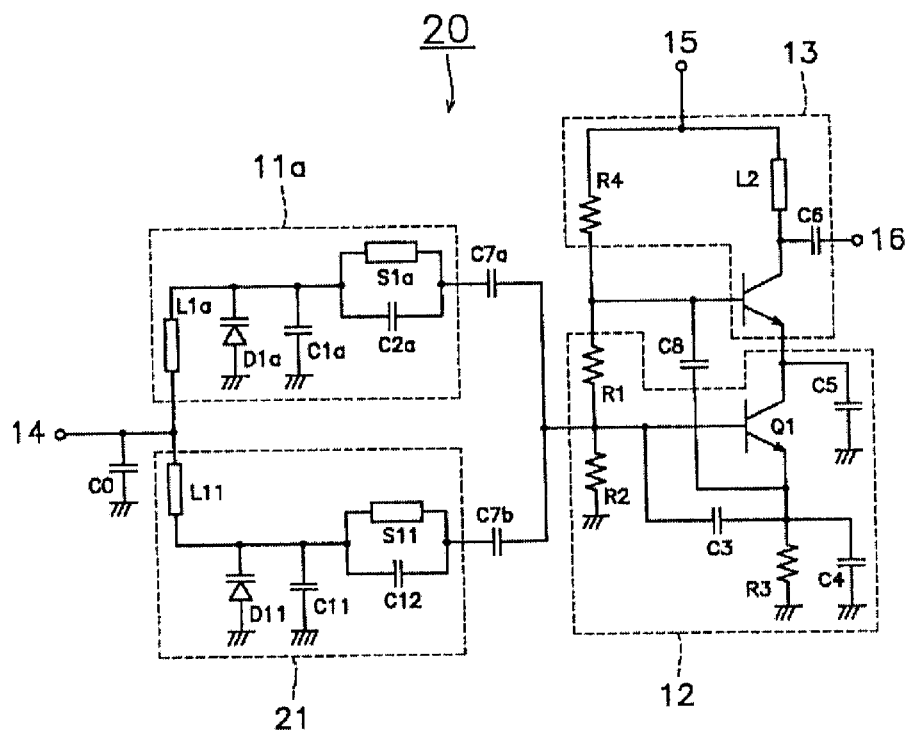
FIG. 5 shows a circuit diagram of a voltage-controlled oscillator according to a second preferred embodiment of the invention.

FIG. 5 shows a circuit diagram of a voltage-controlled oscillator according to a second preferred embodiment of the present invention. Unlike the voltage-controlled oscillator 10 of the first preferred embodiment, a voltage-controlled oscillator 20 includes a second resonant circuit 21 having a series resonant circuit including a variable-capacitance diode D11 and a stripline S11.

Specifically, the second resonant circuit 21 preferably includes the variable-capacitance diode D11, the stripline S11 defining a resonator, a coil L1, capacitors C11 and C12. The variable-capacitance diode D11 and the stripline S11 constitute a series resonant circuit.

In the voltage-controlled oscillator according to each of the first and second preferred embodiments, since the first resonant circuit has the series resonant circuit to maintain high impedance at 1800 MHz, even though the first resonant circuit is connected to the second resonant circuit, the arrangement can prevent the first resonant circuit from being a load on the second resonant circuit. As a result, since the first resonant circuit has only slight influence on the second resonant circuit at 1800 MHz, characteristic deterioration of the voltage-controlled oscillator is reliably prevented.

In addition, since the voltage-controlled oscillator includes the single oscillation circuit and the single amplifying circuit, the voltage-controlled oscillator is easily miniaturized.

Figure 6:
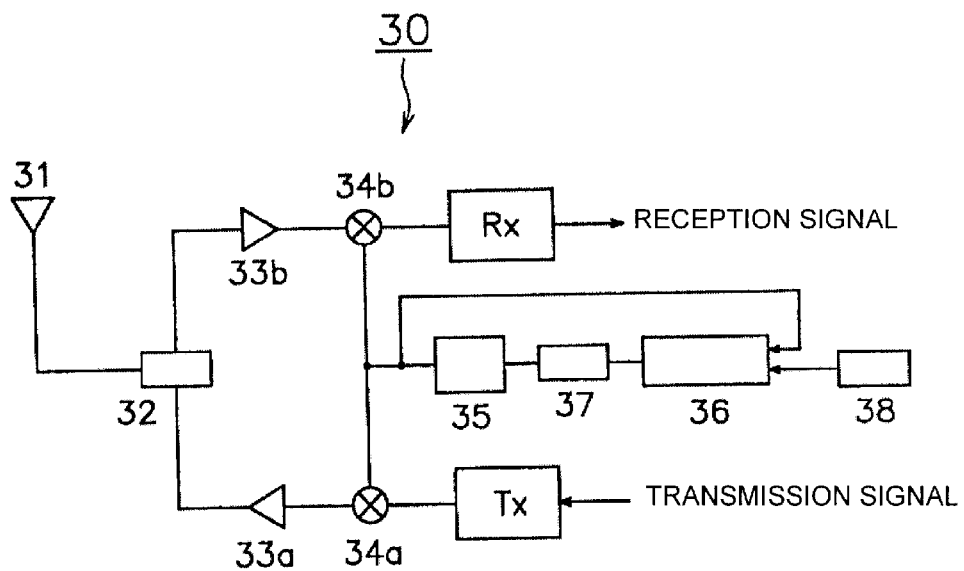
FIG. 6 shows a block diagram of a communication apparatus according to a preferred embodiment of the invention.

FIG. 6 shows a block diagram of a communication apparatus according to another preferred embodiment of the invention. A communication apparatus 30 preferably includes an antenna 31, a duplexer 32, amplifying units 33a and 33b, mixing units 34a and 34b, a voltage-controlled oscillator 35, a PLL-control circuit 36, a low-pass filter 37, a temperature-compensation crystal oscillation circuit 38, a transmission unit Tx, and a reception unit Rx.

The PLL-control circuit 36 inputs a signal output from the voltage-controlled oscillator 35 to compare the phase of the signal with the phase of an oscillation signal sent from the temperature-compensation crystal oscillation circuit 38. Then, the PLL-control circuit 36 outputs a control voltage to obtain a predetermined frequency and a predetermined phase.

The voltage-controlled oscillator 35 receives the control voltage with a control terminal via a low pass filter 37 to output a high frequency signal according to the control voltage. The high frequency signal is transmitted as a local oscillation signal to each of the mixing units 34a and 34b.

The mixing unit 34a mixes an intermediate frequency signal output from the transmission unit Tx with the local oscillation signal to convert into a transmission signal. The amplifying unit 33a amplifies the transmission signal and the antenna 31 transmits the amplified signal via the duplexer 32.

The amplifying unit 33b amplifies a signal received by the antenna 31 via the duplexer 32. The mixing unit 34b mixes the reception signal amplified by the amplifying unit 33b with the local oscillation signal sent from the voltage-controlled oscillator 35 to convert into an intermediate frequency signal. The reception unit Rx processes the intermediate frequency signal.

The voltage-controlled oscillator according to each of the first and second preferred embodiments is preferably used as a voltage-controlled oscillator included in the above communication apparatus.

The communication apparatus of the above preferred embodiments preferably includes the voltage-controlled oscillator capable of preventing the characteristic deterioration in the first and second frequency bands. As a result, the communication apparatus achieves excellent communication characteristics both in the first and second frequency bands.

In the voltage-controlled oscillator of various preferred embodiments of the present invention, for example, there are provided combinations of first and second frequency bands, such as the combination of a digital cellular system (DCS) and a global system for mobile communications (GSM), the combination of a personal communication services (PCS) system and an advanced mobile phone services (AMPS) system, the combination of a digital European cordless telephone (DECT) system and the GSM, and the combination of a personal handy-phone system (PHS) and a personal digital cellular (PDC) system.

As described above, in the voltage-controlled oscillator of various preferred embodiments of the present invention, the first resonant circuit has high impedance in the second frequency band. This prevents the first resonant circuit from being a load on the second resonant circuit even though the first resonant circuit is connected to the second resonant circuit. As a result, since the first resonant circuit has only very slight influence on the second resonance in the second resonance frequency, the characteristics of the voltage-controlled oscillator are not deteriorated.

In addition, since the first resonant circuit has the series resonant circuit, the first resonant circuit can have high impedance easily in the second resonance frequency band.

Thus, without increasing the size of the oscillator, the arrangement prevents the first resonant circuit from being a load on the second resonant circuit easily. In other words, the influence of the first resonant circuit on the second resonant circuit in the second resonance frequency band can be reduced easily. As a result, characteristic deterioration in the voltage-controlled oscillator can be easily prevented, and furthermore, the voltage-controlled oscillator can be miniaturized.

In addition, since the voltage-controlled oscillator has the single oscillation circuit and the single amplifying circuit, the voltage-controlled oscillator is easily made compact.

The communication apparatus of various preferred embodiments of the present invention includes the voltage-controlled oscillator that is capable of preventing the characteristic deterioration in the first and second frequency bands. Thus, the communication apparatus achieves excellent communication characteristics both in the first and second frequency bands.

While the present invention has been particularly shown and described with reference to preferred embodiments thereof, it will be understood by those skilled in the art that the foregoing and other changes in form and details can be made without departing from the spirit and scope of the present invention.

What is claimed is:

1. A voltage-controlled oscillator comprising:
   a first resonant circuit resonating in a first frequency band;
   a second resonant circuit resonating in a second frequency band that is higher than the first frequency band;
   an oscillation circuit oscillating at respective resonance frequencies of each of the first and second resonant circuits; and
   an amplifying circuit amplifying an oscillation signal transmitted from the oscillation circuit; wherein
   the first resonant circuit has a high impedance point in the second frequency band.

2. A voltage-controlled oscillator according to claim 1, wherein the first resonant circuit is a series resonant circuit including a variable-capacitance diode and a resonator, and the second resonant circuit is a parallel resonant circuit including a variable-capacitance diode and a resonator.

3. A voltage-controlled oscillator according to claim 1, wherein each of the first and second resonant circuits is a series resonant circuit including a variable-capacitance diode and a resonator.

4. A voltage-controlled oscillator according to claim 1, further comprising a control terminal arranged to apply a control voltage to each of the first and second resonant circuits.

5. A voltage-controlled oscillator according to claim 1, further comprising a power-source terminal that is commonly connected to the oscillation circuit and the amplifying circuit, and an output terminal outputting a high frequency signal.

6. A voltage-controlled oscillator according to claim 1, wherein the first resonant circuit includes a variable-capacitance diode, a stripline defining a resonator, a coil, and capacitors.

7. A voltage-controlled oscillator according to claim 1, wherein the second resonant circuit includes a variable-capacitance diode, a stripline defining a resonator, a coil, and capacitors.

8. A voltage-controlled oscillator according to claim 1, wherein the oscillation circuit includes a transistor, capacitors, and resistors.

9. A voltage-controlled oscillator according to claim 1, wherein the amplifying circuit includes a transistor, a coil, a capacitor, and a resistor.

10. A voltage-controlled oscillator according to claim 1, further comprising coupling capacitors, wherein the first and second resonant circuits are connected to the oscillation circuit via said coupling capacitors.

11. A voltage-controlled oscillator according to claim 1, further comprising a coupling capacitor, wherein the oscillation circuit is connected to the amplifying circuit via a coupling capacitor.

12. A voltage-controlled oscillator according to claim 1, wherein the first resonant circuit is a series resonant circuit including a variable-capacitance diode and a resonator, and the second resonant circuit is a series resonant circuit including a variable-capacitance diode and a stripline.

13. A voltage-controlled oscillator according to claim 12, wherein the second resonant circuit includes the variable-capacitance diode, the stripline defining a resonator, a coil, and capacitors.

14. A communication apparatus comprising:
   at least one voltage-controlled oscillator including:
      a first resonant circuit resonating in a first frequency band;
      a second resonant circuit resonating in a second frequency band that is higher than the first frequency band;
      an oscillation circuit oscillating at respective resonance frequencies of each of the first and second resonant circuits; and
      an amplifying circuit amplifying an oscillation signal transmitted from the oscillation circuit; wherein
         the first resonant circuit has a high impedance point in the second frequency band.

15. A communication apparatus according to claim 14, wherein the first resonant circuit is a series resonant circuit including a variable-capacitance diode and a resonator, and the second resonant circuit is a parallel resonant circuit including a variable-capacitance diode and a resonator.

16. A communication apparatus according to claim 14, wherein each of the first and second resonant circuits is a series resonant circuit including a variable-capacitance diode and a resonator.

17. A communication apparatus according to claim 14, further comprising a control terminal arranged to apply a control voltage to each of the first and second resonant circuits.

18. A communication apparatus according to claim 14, further comprising a power-source terminal that is commonly connected to the oscillation circuit and the amplifying circuit, and an output terminal outputting a high frequency signal.

19. A communication apparatus according to claim 14, wherein the first resonant circuit includes a variable-capacitance diode, a stripline defining a resonator, a coil, and capacitors.

20. A communication apparatus according to claim 14, wherein the second resonant circuit includes a variable-capacitance diode, a stripline defining a resonator, a coil, and capacitors.

* * * * *